United States Patent
Smith et al.

(10) Patent No.: US 6,828,668 B2
(45) Date of Patent: Dec. 7, 2004

(54) FLEXIBLE LEAD STRUCTURES AND METHODS OF MAKING SAME

(75) Inventors: John W. Smith, Horseshoe Bay, TX (US); Belgacem Haba, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/290,010

(22) Filed: Nov. 7, 2002

(65) Prior Publication Data

US 2003/0071346 A1 Apr. 17, 2003

Related U.S. Application Data

(63) Continuation of application No. 09/659,302, filed on Sep. 12, 2000, now abandoned, which is a continuation of application No. 09/267,058, filed on Mar. 12, 1999, now Pat. No. 6,117,694, said application No. 09/267,058, and a continuation-in-part of application No. 09/138,858, filed on Aug. 24, 1998, now Pat. No. 6,104,087, which is a division of application No. 08/440,665, filed on May 15, 1995, now Pat. No. 5,801,441, which is a division of application No. 08/271,768, filed on Jul. 7, 1994, now Pat. No. 5,518,964, application No. 09/267,058, and a continuation-in-part of application No. 08/989,312, filed on Dec. 12, 1997, now Pat. No. 5,989,936, application No. 09/267,058, which is a continuation-in-part of application No. 09/140,589, filed on Aug. 26, 1998, now Pat. No. 6,228,686.

(60) Provisional application No. 60/077,928, filed on Mar. 13, 1998, provisional application No. 60/032,828, filed on Dec. 13, 1996, provisional application No. 60/056,965, filed on Aug. 26, 1997, and provisional application No. 60/057,741, filed on Aug. 28, 1997.

(51) Int. Cl.[7] .............................. H01L 23/48; H05K 1/00
(52) U.S. Cl. ...................... 257/696; 257/690; 257/692; 439/66; 439/91
(58) Field of Search ................................ 257/696, 690, 257/692; 439/66, 91

(56) References Cited

U.S. PATENT DOCUMENTS

| 3,373,481 A | 3/1968 | Lins et al. ...................... 29/471 |
| 3,374,537 A | 3/1968 | Doelp, Jr. ...................... 435/14 |
| 3,460,105 A | 8/1969 | Birt et al. ...................... 435/14 |
| 3,795,037 A | 3/1974 | Luttmer ....................... 29/883 |
| 3,811,186 A | 5/1974 | Larnerd et al. .............. 437/180 |

(List continued on next page.)

FOREIGN PATENT DOCUMENTS

| EP | 0072673 A2 | 8/1982 |
| EP | 0 352 020 A3 | 1/1990 |
| EP | 0 443 997 A2 | 6/1991 |
| GB | 2151529 | 12/1983 |
| GB | 2142568 | 7/1984 |
| GB | 2 142 568 | 1/1985 |
| JP | 61-91939 | 5/1986 |
| JP | 1-155633 | 6/1989 |
| JP | 3-198734 | 8/1991 |
| WO | WO 94/03036 | 2/1994 |
| WO | WO 98/11588 | 3/1997 |
| WO | WO 98/44564 | 10/1998 |

OTHER PUBLICATIONS

"Method of Testing Chips and Joining Chips toSubstrates," Research Disclosure, Feb., 1991, No. 322, Kenneth Mason Publication Ltd., England. IBM Technical Disclosure Bulletin, vol. 36, No. 07, Jul. 1993.

(List continued on next page.)

*Primary Examiner*—Jasmine Clark
(74) *Attorney, Agent, or Firm*—Lerner, David, Littenberg, Krumholz & Mentlik, LLP

(57) ABSTRACT

An interconnect component comprises a compliant layer having a first surface and a plurality of electrically conductive leads having first ends and extending through the compliant layer. The first ends extend generally parallel to said first surface.

66 Claims, 8 Drawing Sheets

U.S. PATENT DOCUMENTS

| | | | |
|---|---|---|---|
| 3,825,353 A | 7/1974 | Loro | 317/234 |
| 3,842,189 A | 10/1974 | Southgate | 174/52 |
| 3,952,404 A | 4/1976 | Matunami | 437/182 |
| 4,067,104 A | 1/1978 | Tracy | 361/803 |
| 4,142,288 A | 3/1979 | Flammer et al. | 257/784 |
| 4,234,666 A | 11/1980 | Gorsky | 428/573 |
| 4,326,663 A | 4/1982 | Oettel | 228/123 |
| 4,447,857 A | 5/1984 | Marks et al. | 361/739 |
| 4,451,505 A | 5/1984 | Jans | 427/98 |
| 4,520,562 A | 6/1985 | Sade et al. | 29/787 |
| 4,629,957 A | 12/1986 | Walteis et al. | 257/418 |
| 4,642,889 A | 2/1987 | Grabbe | 29/840 |
| 4,651,191 A | 3/1987 | Ooue et al. | 257/772 |
| 4,661,192 A | 4/1987 | McShaen | 257/705 |
| 4,667,219 A | 5/1987 | Lee et al. | 257/693 |
| 4,721,995 A | 1/1988 | Tanizawa | 257/777 |
| 4,751,199 A | 6/1988 | Phy | 437/209 |
| 4,785,137 A | 11/1988 | Samuels | 257/741 |
| 4,793,814 A * | 12/1988 | Zifcak et al. | 439/66 |
| 4,812,191 A | 3/1989 | Ho et al. | 156/239 |
| 4,893,172 A | 1/1990 | Matsumoto et al. | 257/668 |
| 4,926,241 A | 5/1990 | Carey | 257/698 |
| 4,937,653 A | 6/1990 | Blonder et al. | 257/739 |
| 4,949,158 A | 8/1990 | Ueda | 257/774 |
| 4,954,877 A | 9/1990 | Nakanishi et al. | 257/698 |
| 4,955,523 A | 9/1990 | Calomagno et al. | 228/180 |
| 5,047,830 A | 9/1991 | Grabbe | 257/692 |
| 5,049,085 A | 9/1991 | Reylek et al. | 439/91 |
| 5,055,907 A | 10/1991 | Jacobs | 257/773 |
| 5,057,460 A | 10/1991 | Rose | 257/679 |
| 5,065,223 A | 11/1991 | Matsuki et al. | 257/692 |
| 5,067,007 A | 11/1991 | Otsuka et al. | 257/701 |
| 5,086,337 A | 2/1992 | Noro et al. | 257/726 |
| 5,131,852 A | 7/1992 | Grabbe et al. | 439/71 |
| 5,133,495 A | 7/1992 | Angulas et al. | 228/180.1 |
| 5,148,265 A | 9/1992 | Khandros et al. | 357/80 |
| 5,148,266 A | 9/1992 | Khandros et al. | 357/80 |
| 5,152,695 A | 10/1992 | Grabbe et al. | 439/71 |
| 5,166,099 A | 11/1992 | Ueda et al. | 437/220 |
| 5,173,055 A | 12/1992 | Grabbe | 439/66 |
| 5,173,574 A | 12/1992 | Kraus | 257/775 |
| 5,177,863 A | 1/1993 | Lam | 257/786 |
| 5,192,716 A | 3/1993 | Jacobs | 351/50 |
| 5,196,268 A | 3/1993 | Fritz | 437/220 |
| 5,197,892 A | 3/1993 | Yoshizawa et al. | 439/91 |
| 5,203,075 A | 4/1993 | Angulas et al. | 29/830 |
| 5,210,939 A | 5/1993 | Mallik et al. | 437/209 |
| 5,221,428 A | 6/1993 | Ohsawa et al. | 437/220 |
| 5,225,633 A | 7/1993 | Wigginton | 257/666 |
| 5,230,144 A | 7/1993 | Ootsuki | 437/220 |
| 5,230,931 A | 7/1993 | Yanizak et al. | 427/569 |
| 5,254,811 A | 10/1993 | Ludden et al. | 361/751 |
| 5,258,330 A | 11/1993 | Khandros et al. | 437/217 |
| 5,266,520 A | 11/1993 | Cipolla et al. | 437/220 |
| 5,286,680 A | 2/1994 | Cain | 437/216 |
| 5,316,788 A | 5/1994 | Dibble et al. | 427/98 |
| 5,346,861 A | 9/1994 | Khandros et al. | 437/209 |
| 5,354,422 A | 10/1994 | Kato et al. | 437/220 |
| 5,376,326 A | 12/1994 | Medney et al. | 264/510 |
| 5,398,863 A | 3/1995 | Grube et al. | 228/106 |
| 5,430,614 A | 7/1995 | Difrancesco | 361/785 |
| 5,432,127 A | 7/1995 | Lamson et al. | 437/220 |
| 5,455,390 A | 10/1995 | DiStefano et al. | 174/262 |
| RE35,119 E | 12/1995 | Blonder et al. | 257/739 |
| 5,518,964 A | 5/1996 | DiStefano et al. | 437/209 |
| 5,525,545 A | 6/1996 | Grube et al. | 437/209 |
| 5,528,083 A | 6/1996 | Malladi et al. | 257/786 |
| 5,548,091 A | 8/1996 | DiStefano et al. | 174/260 |
| 5,557,501 A | 9/1996 | DiStefano et al. | 361/704 |
| 5,590,460 A | 1/1997 | DiStefano et al. | 29/830 |
| 5,615,824 A | 4/1997 | Fjelstad et al. | 228/180.1 |
| 5,629,239 A | 5/1997 | DiStefano et al. | 216/14 |
| 5,650,914 A | 7/1997 | DiStefano et al. | 361/704 |
| 5,679,977 A | 10/1997 | Khandros et al. | 257/692 |
| 5,682,061 A | 10/1997 | Khandros et al. | 257/666 |
| 5,688,716 A | 11/1997 | DiStefano et al. | 437/182 |
| 5,763,941 A | 6/1998 | Fjelstad | 257/669 |
| 5,801,441 A | 9/1998 | DiStefano et al. | 439/91 |
| 5,859,472 A | 1/1999 | DiStefano et al. | 257/674 |
| 5,966,587 A | 10/1999 | Karavakis et al. | 438/118 |
| 5,989,936 A | 11/1999 | Smith et al. | 438/106 |
| 6,117,694 A | 9/2000 | Smith et al. | 438/14 |

OTHER PUBLICATIONS

"Electronic Packaging and Interconnection Handbook," pp. 7.24–7.25; Harper. Research Disclosure No. 322 (Feb. 1991) "Method of Testing Chips and Joining Chips to Substrates," XP 000169195.

* cited by examiner

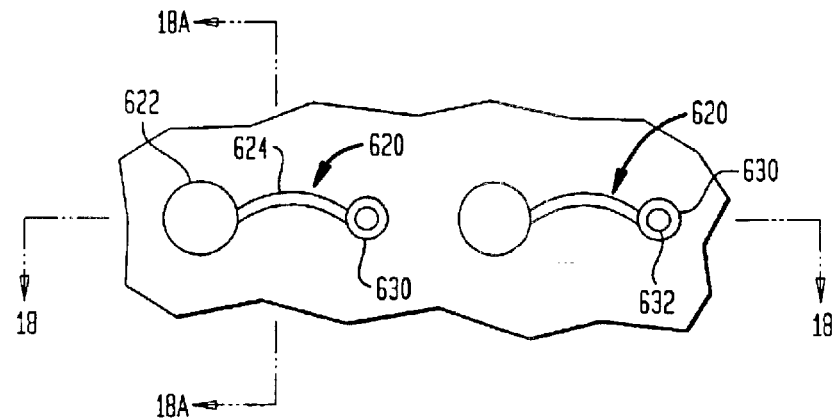
FIG. 17
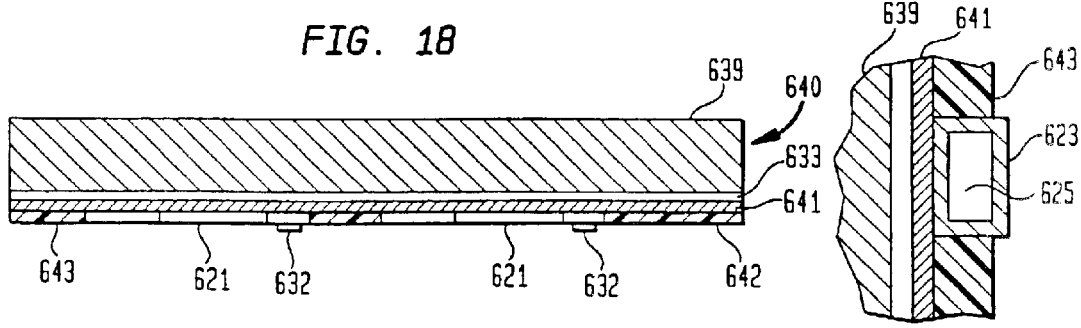
FIG. 18
FIG. 18A
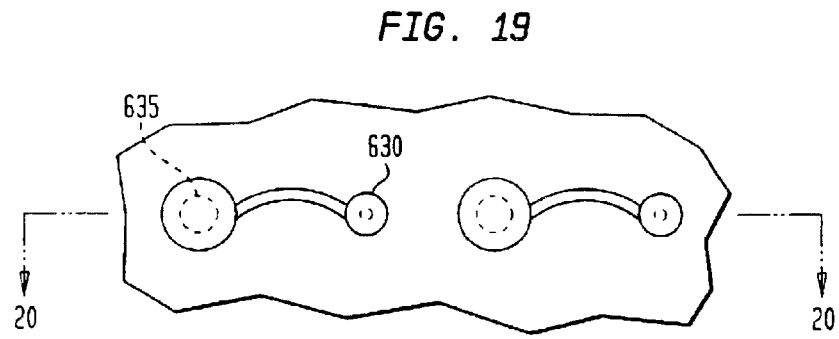
FIG. 19
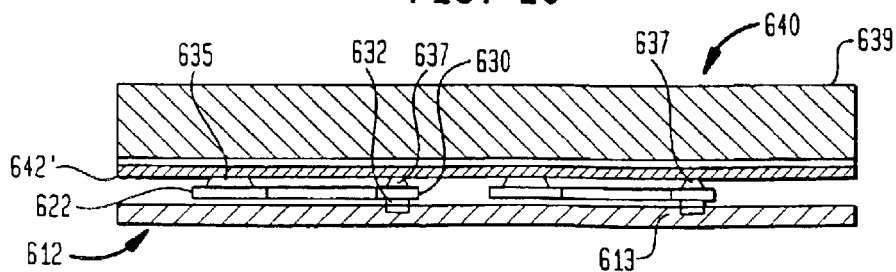
FIG. 20

FLEXIBLE LEAD STRUCTURES AND METHODS OF MAKING SAME

CROSS-REFERENCE TO RELATED APPLICATIONS

This application is a continuation of U.S. patent application Ser. No. 09/659,302, filed Sep. 12, 2000, since abandoned, which is a continuation of U.S. patent application Ser. No. 09/267,058, filed Mar. 12, 1999, now U.S. Pat. No. 6,117,694, the disclosures of which are all hereby incorporated by reference herein. The present application claims benefit of U.S. Provisional Patent Application No. 60/077,928, filed Mar. 13, 1998, the disclosure of which is incorporated by reference herein application Ser. No. 09/267,058 is a continuation-in-part of U.S. patent application Ser. 09/138,858, now U.S. Pat. No. 6,104,087, filed Aug. 24, 1998, which in turn is a divisional of U.S. patent application Ser. No. 08/440,665 filed May 15, 1995, now U.S. Pat. No. 5,801,441, which in turn is a divisional of U.S. patent application Ser. No. 08/271,768 filed Jul. 7, 1994, now U.S. Pat. No. 5,518,964, the disclosures of which are all hereby incorporated by reference herein application Ser. No. 09/267,058 is also a continuation-in-part of U.S. patent application Ser. No. 08/989,312 filed Dec. 12,1997, now U.S. Pat. No. 5,989,936, the disclosure of which is also incorporated by reference herein, which in turn claims benefit of U.S. Provisional Patent Application No. 60/032,828, filed Dec. 13, 1996, the benefit of which is claimed herein and the disclosure of which is also incorporated by reference herein application Ser. No. 09/267,058 is a continuation-in-part of U.S. patent application Ser. No. 09/140,589, filed Aug. 26, 1998, now U.S. Pat. No. 6,228,686, which claims benefit of Provisional Application Nos. 60/056,965, filed Aug. 26, 1997 and 60/057,741, filed Aug. 28, 1997, the disclosures of which are hereby incorporated by reference herein.

BACKGROUND OF THE INVENTION

The present invention relates to microelectronic packaging and more particularly relates to methods of making connectors and packaged microelectronic components. In various microelectronic devices, it is desirable to provide a connection between two components, which can accommodate relative movement between the components. For example, where a semiconductor chip is mounted to a circuit board, thermal expansion and contraction of the chip and circuit board can cause the contacts on the chip to move relative to the corresponding electrically conductive features of the circuit board. This can occur during service and can also occur during manufacturing operations as, for example, during soldering operations on the circuit board.

As illustrated in certain preferred embodiments of U.S. Pat. No. 5,518,964 ("the '964 patent") movable interconnections between elements such as a semiconductor chip and another element can be provided by first connecting leads between the elements and then moving the elements away from one another through a preselected displacement so as to bend the leads. For example, a connection component may incorporate a dielectric body and leads extending along a bottom surface of the dielectric body. The leads may have first or fixed ends permanently attached to the dielectric element and connected to electrically conductive features such as terminals, traces or the like on the dielectric body. The leads may also have second ends releasably attached to the dielectric body. The dielectric body, with the leads thereon, may be juxtaposed with the chip and the second ends of the leads may be bonded to contacts on the chip. Following bonding, the dielectric body and chip are moved away from one another, thereby bending the leads towards a vertically extensive disposition. During or after movement, a curable material such as a liquid composition is introduced between the elements. This is cured to form a compliant dielectric layer such as an elastomer or gel surrounding the leads. The resulting packaged semiconductor chip has terminals on the dielectric body connection component which are electrically connected to the contacts on the chip but which can move relative to the chip so as to compensate for thermal effects. For example, the packaged chip may be mounted to a circuit board by solder-bonding the terminals to conductive features on the circuit board. Relative movement between the circuit board and the chip due to thermal effects is taken up in the moveable interconnection provided by the leads and the compliant layer.

Numerous variations of these processes and structures are disclosed in the '964 patent. For example, the package-forming process can be conducted on a wafer scale, so that the numerous semiconductor chips in a unitary wafer are connected to connection components in one sequence of operations. The resulting packaged wafer is then severed so as to provide individual units, each including one or more of the chips and portions of the dielectric body associated therewith. Also, the leads may be formed on the chip or wafer rather than on the dielectric body. In further embodiments, also disclosed in the '964 patent, a connector for use in making connections between two other microelectronic elements is fabricated by a generally similar process. For example, in one embodiment a dielectric body having terminals and leads as discussed above is connected to terminal structures on a temporary sheet. The temporary sheet and dielectric body are moved away from one another so as to bend the leads, and a liquid material is introduced around the leads and cured so as to form a compliant layer between the temporary sheet and the dielectric body. The temporary sheet is then removed, leaving the tip ends of the terminal structures projecting from a surface of the compliant layer. Such a component may be used, for example, by engaging it between two other components. For example, the terminal structures may be engaged with a semiconductor chip, whereas the terminals on the dielectric body may be engaged with a circuit panel or other microelectronic component.

Thus, the broad invention taught in the '964 patent offers numerous desirable ways of making electrical interconnections and connectors.

SUMMARY OF THE INVENTION

In a first aspect of the present invention, an interconnect component comprises a compliant layer and a plurality of electrically conductive leads having first ends and extending through the compliant layer. The first ends comprise elongated portions of the leads exposed at a first surface of the compliant layer and are located at or near said first surface.

In certain preferred embodiments, the compliant layer has a second surface opposite the first surface. The leads desirably have second ends opposite the first ends and the second ends are located at or near the second surface of the compliant layer.

The leads may have any shape. In certain preferred embodiments, the leads have midsections with a width less than the width of the first ends. The leads may have midsections with a width less than the width of the second ends.

The first ends of the leads may be located at upper sides of said leads and the second ends may be located at lower sides of the leads so that the upper sides are exposed at the first surface of the compliant layer and the lower sides are exposed at the second surface of the compliant layer.

In certain embodiments, releasable bonding material is disposed on the first ends. The releasable bonding material may comprise any releasable bonding material. The releasable bonding material may comprise an adhesive or a solder. Releasable bonding material may be included on the second ends of the leads.

In certain embodiments, the component comprises a temporary support structure. The first ends are connected to the temporary support structure. The component may include a first temporary support structure and a second temporary support structure. The first ends are desirably connected to the first temporary support structure and the second ends are desirably connected to the second temporary support structure. In certain embodiments, the leads extend between the first temporary support structure and the second temporary support structure in a generally vertical configuration.

In a further aspect of the present invention an interconnect component comprises a compliant layer having a first surface and a plurality of electrically conductive leads having first ends and extending through the compliant layer. The first ends extend generally parallel to the first surface.

In certain preferred embodiments, the compliant layer has a second surface opposite the first surface. The leads desirably have second ends opposite the first ends. The first ends are located at or near the first surface and the second ends are located at or near the second surface of the compliant layer.

The leads may have any shape. In certain preferred embodiments, the leads have midsections with a width less than the width of the first ends. The leads may have midsections with a width less than the width of the second ends.

The first ends of the leads may be located at upper sides of said leads and the second ends may be located at lower sides of the leads so that the upper sides are exposed at the first surface of the compliant layer and the lower sides are exposed at the second surface of the compliant layer.

In certain embodiments, releasable bonding material is disposed on the first ends. The releasable bonding material may comprise any releasable bonding material. The releasable bonding material may comprise an adhesive or a solder. Releasable bonding material may be included on the second ends of the leads.

In certain embodiments, the component comprises a temporary support structure. The first ends are connected to the temporary support structure. The component may include a first temporary support structure and a second temporary support structure. The first ends are desirably connected to the first temporary support structure and the second ends are desirably connected to the second temporary support structure. In certain embodiments, the leads extend between the first temporary support structure and the second temporary support structure in a generally vertical configuration.

Figure 14:
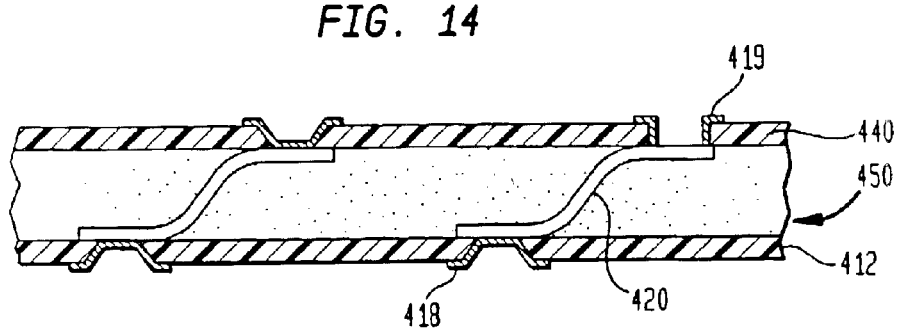
Figure 15:
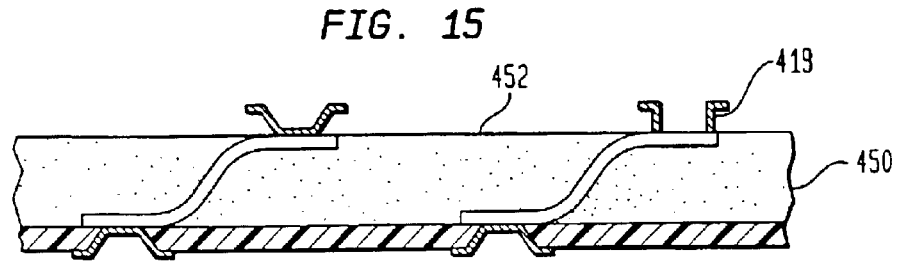
Figure 16:
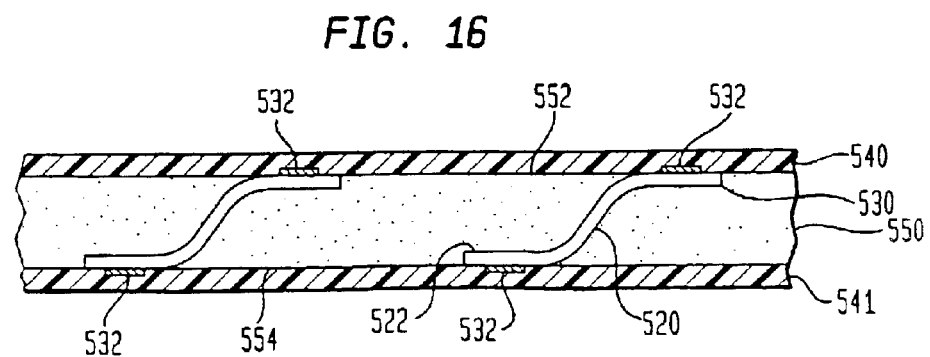

Each of FIGS. 14, 15 and 16 is a diagrammatic, sectional view depicting a further connector made in accordance with a further embodiment of the invention.

FIG. 17 is a fragmentary, diagrammatic view depicting a component according to yet another embodiment of the invention.

FIG. 18 is a diagrammatic, sectional view taken along line 18—18 in FIG. 17.

FIG. 18A is a detailed sectional view on an enlarged scale taken along line 18A—18A in FIG. 17

FIGS. 19 and 20 are views similar to FIGS. 17 and 18, respectively, but depicting the component in a later stage of a process in accordance with a further embodiment of the invention.

Figure 21:
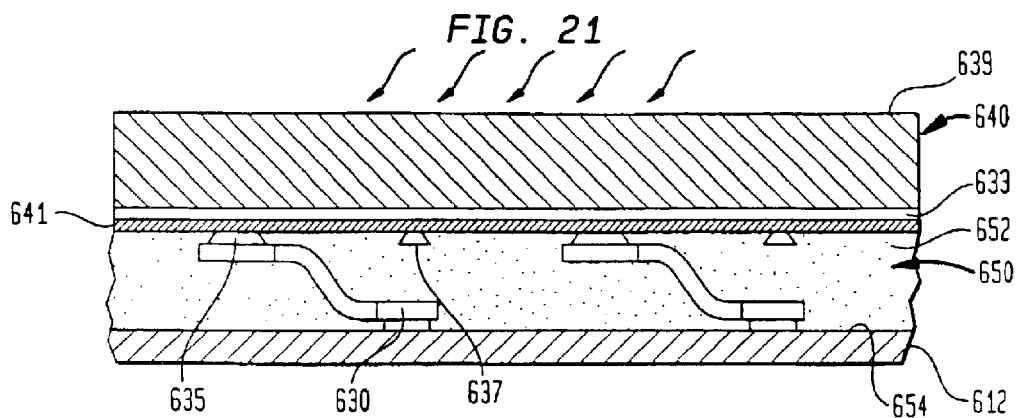
Figure 22:
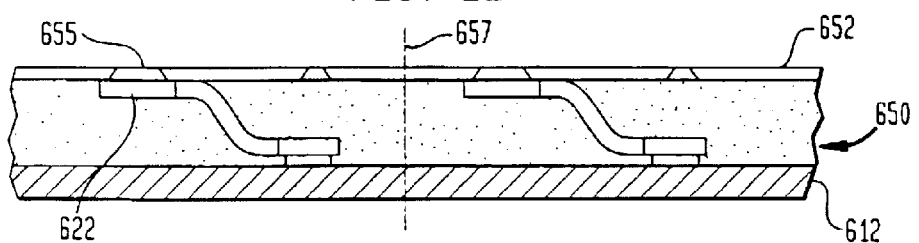

FIGS. 21 and 22 are views similar to FIGS. 18 and 20 but depicting the component during still later stages of the process.

Figure 23:
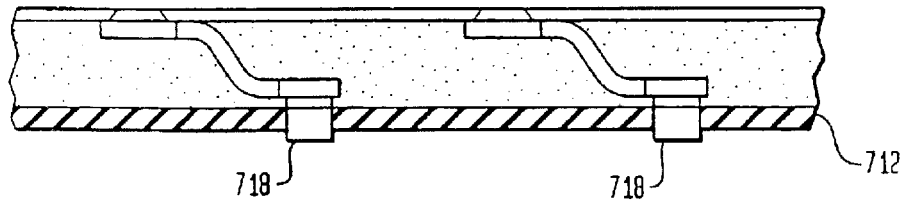

FIG. 23 is a diagrammatic, sectional view depicting a connector made in accordance with yet another embodiment of the invention.

Figure 24:
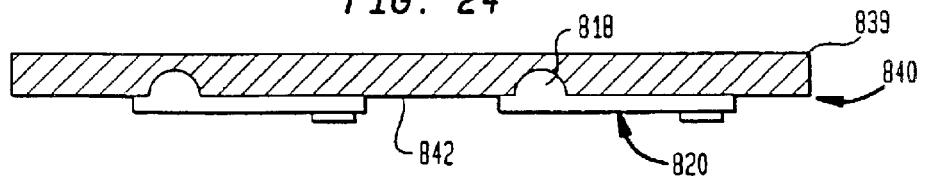

FIG. 24 is a diagrammatic, sectional view depicting a component in accordance with yet another embodiment of the invention.

Figure 25:
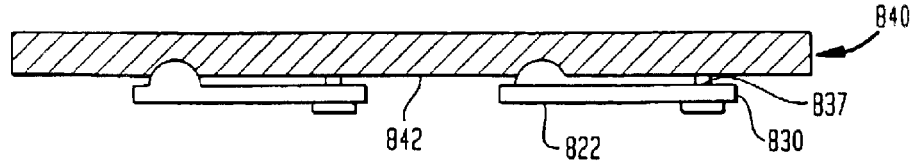

FIG. 25 is a diagrammatic, sectional view of the components depicted in FIG. 24 at a later stage during its processing.

Figure 26:
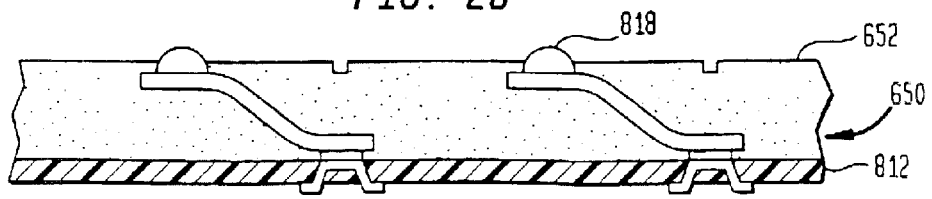

FIG. 26 is a diagrammatic, sectional view depicting a connector made using the component of FIGS. 24–25.

Figure 27:
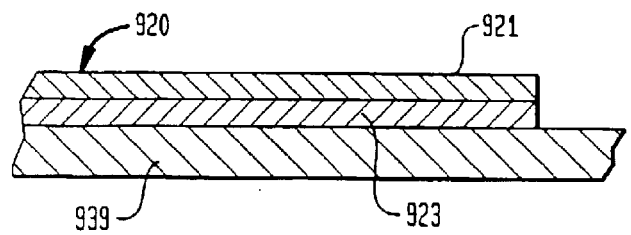

FIG. 27 is a fragmentary, diagrammatic, elevational view depicting a component in accordance with yet another embodiment of the invention.

Figure 28:
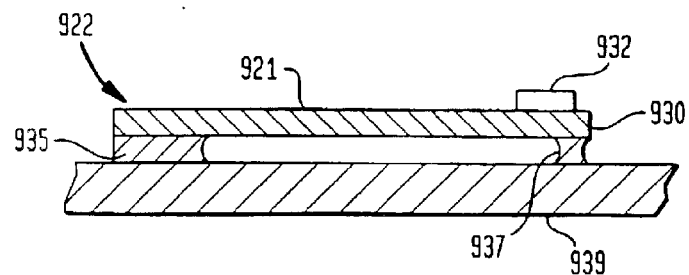

FIG. 28 is a diagrammatic, sectional view depicting the component of FIG. 27 at a still later stage of the process.

Figure 29:
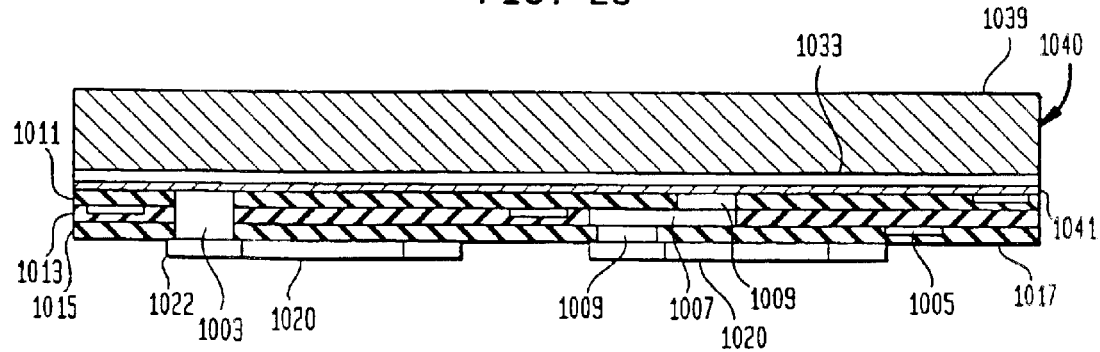

FIG. 29 is a fragmentary, sectional view depicting a component in accordance with yet another embodiment of the invention.

Each of FIGS. 30, 31, 32 and 33 is a diagrammatic, sectional view depicting the component of FIG. 29 in a later stage of a process.

DETAILED DESCRIPTION OF THE PREFERRED EMBODIMENTS

Figure 1:
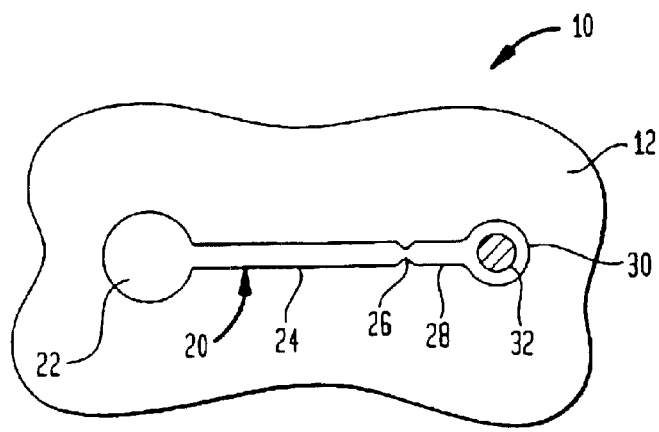
FIG. 1 is a fragmentary, diagrammatic plan view depicting an element using a process according to one embodiment of the invention.

A method in accordance with one embodiment of the invention utilizes a connection component 10 having a flat, sheetlike body 12. Body 12 has a top surface 14 and a bottom surface 16. As used in this disclosure, the terms "top" and "bottom" as well as the directional terms "vertical" and "horizontal" should be understood as referring to an arbitrary frame of reference defined by the components themselves. Thus, body 12 has horizontal directions (to be left and right in FIG. 2) along its surfaces and has vertical directions transverse to such horizontal directions. The particular component illustrated in FIGS. 1 and 2 has a body 12 consisting of a single layer of a dielectric material such as a polyamide. Where body 12 is intended to be flexible, the body desirably is between about 25 and about 100 mm thick and typically about 25–75 mm thick although other thicknesses can be employed. Although body 12 is illustrated as including only a single layer of dielectric material, it should be appreciated that the body can include other features such as multiple dielectric layers; electrically conductive traces extending in horizontal directions along the surfaces of the body or within the body; electrically conductive ground planes or power planes also extending in a horizontal direction on a surface of the body or within the body, as well as electrically conductive vias connecting these features with one another.

Figure 2:
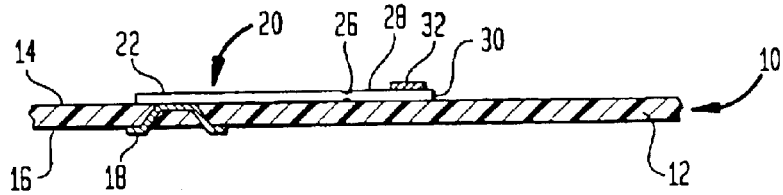
FIG. 2 is a diagrammatic sectional view depicting the element of FIG. 1.

The connection component further includes terminal structures or vias 18 extending through body 12 from a top surface 14 to a bottom surface 16. Typically, connection component 10 includes numerous terminal structures, only one of which is shown in FIG. 2. Each terminal structure defines a terminal, which is exposed at the bottom surface 16 of body 12. The particular terminal structure illustrated in FIG. 2 extends onto the bottom surface. However, other configurations may be used if the terminal structure is accessible for engagement with conductive components facing toward the bottom surface 16. Thus, the terminal structure may be recessed slightly into body 12 and still may be accessible at the bottom surface 16.

Connection component 10 also includes leads 20. Each lead includes a body-attached end 22 formed integrally with a terminal structure or via lines 18. Each lead further includes an elongated main portion 24, a frangible section 26 and a stub portion 28 connected to the end of the main portion 24 by the frangible section 26. Each lead further has a free end 30 at the end of the stub portion remote from the main portion and remote from the body-attached end 22. The free end 30 of each lead carries a mass of a releasable bonding material, such as a heat-degradable adhesive or a solder. The leads and the terminal structures are arranged in a pattern corresponding to the pattern of elements to be connected by the finished connector made in the process. In one embodiment, the features can be arranged in a "area array," i.e., an array of features arranged in a substantially regular pattern with a substantially uniform density of features throughout the horizontal extent of the pattern. In this case, the leads and terminal structures are also arranged in an area array. The dimensions of the leads are selected in accordance with the pitch of the array. The leads can be of essentially any size. However, for common area array applications the pitch or center-to-center distances between corresponding features on different leads in the array is about 200–1500 microns and the length of each lead between free end 30 and body attached end 22 typically is about 300–1500 microns.

Other arrangements of leads may be employed as well. For example, where the chips include rows of contacts extending along the periphery of the chip front surface, the leads may be arranged so that after bonding, the leads will project inwardly from the chip contacts, over the front surface of the chip, in a so-called "fan-in" pattern. Alternatively, the leads may be arranged to project outwardly from the chip contacts, in a so-called "fan-out" pattern. Still other chips have contacts disposed in rows or clusters such as in one or more rows near the center of the chip front surface. The leads may be arranged to connect to these contacts. In any of these arrangements, the ends of the leads which are adapted to connect to the chip contacts are disposed at a spacing corresponding to the contact pad pitch or center-to-center distance of the chip, typically about 50–300 μm and more typically 75–150 μm. The other ends of the leads typically are more widely spaced from one another.

The thickness of the leads in their main portions typically is between 5 and 50 microns, more typically between 10 and 30 microns. The leads may be fabricated from essentially any conductive material, but most typically are formed from conductive metals such as copper, copper alloys, gold, gold alloys and composites including layers of these materials.

In the particular arrangement illustrated, the main portion 24 and stub portion 28 of each lead have generally constant width and thickness, whereas the frangible portion 26 of each lead has the same thickness but has a lesser width. Other configurations may be employed. For example, as described in greater detail in U.S. Pat. No. 5,629,239, the disclosure of which is hereby incorporated by reference herein, the frangible sections of the leads may be of the same width as the adjacent portions of the lead but of lesser thickness. The frangible section desirably has a moment of inertia about the horizontal neutral plane of the lead, which is substantially less than the moment of inertia of the immediately adjacent sections. Stated another way, the frangible section desirably is substantially weaker in bending and in vertical directions than the adjacent sections of the lead. The entire lead, other than the body-attached end 22 desirably is releasably connected to the top surface 14 of body 12. For example, the lead may have a low-adhesion connection to the polymeric body as described, for example, in U.S. Pat. No. 5,763,941 the disclosure of which is incorporated by reference herein. Alternatively, the lead may have a releasable connection to the polymeric body 12 of the types described in the '964 patent or in copending, commonly assigned U.S. patent application Ser. No. 09/020,750, filed Feb. 9, 1998 and Ser. No. 09/195,371, filed Nov. 18, 1998, the disclosures of which are also incorporated by reference herein.

Free end 3 and 30 of each lead carries a bonding material 32 on its upper face, i.e., on the face directed away from body 12. Bonding material 32 may be a solder or other metallic bonding material or else may be an adhesive or other non-metallic bonding materials. As bonding material 32 is not incorporated into the finished device made by the process, the properties of the bonding material are relatively unimportant. However, the bonding materials should be capable of adhering to the temporary reinforcing structure as discussed below and should not contaminate the other portions of the device. Also bundling material 32 should be capable of releasing from the support structure as discussed below. Where the bonding material liquefies during the process as, for example, where the bonding material is a solder, leads 20 and may be provided with non-wettable surfaces so as to confine the liquid bonding material as described in greater detail in copending, commonly assigned U.S. patent application Ser. No. 09/233,586, the disclosure of which is also incorporated by reference herein.

Connection component 10 may be fabricated using conventional techniques and using the techniques discussed in the aforementioned patents and publications. Merely by way of example, leads 20 may be formed by conventional photolithographic processes. Terminal structures 18 may be formed by laser ablating or etching body 12 so as to form holes extending through the body and by plating the interiors of such holes as, for example, by electroless plating followed by electroplating using appropriate temporary conductive structures (not shown) which are then removed.

In a process according to one embodiment of the invention, a connection component 10 as discussed above with reference to FIGS. 1 and 2 is engaged with a temporary support 40 having a bottom surface 42 and a top surface of 44 so that the bottom surface of the temporary support faces towards the top surface 14 of connection component body 12. The free ends 32 of leads 20 are bonded to the bottom surface. The bottom surface is compatible with the bonding material 32. For example, where the bonding material includes a solder, the bottom surface 42 has wettable surface regions in the areas where the bottom surface engages the free ends of the leads. The bottom surface 42 also may be provided with non-wettable surface regions so as to limit the spread of a solder or other liquefiable bonding material. The bottom surface of the temporary support is engaged with the free ends of the leads while the leads are in their flat or undeformed condition as illustrated in FIG. 2. Bonding may be facilitated by engaging the connection component 12 and temporary support 40 between a pair of opposed platens and forcing the platens towards one another so as to apply pressure on the regions to be bonded. Alternatively or additionally, a fluid such as a gas under pressure may be introduced between the surfaces of the platens and the top surface 44 of the temporary support, between the surfaces of the platen and the bottom surface 16 of the connection component body or both. Thus, after bonding, each lead has a first end (free end 30) attached to the temporary support and has a second end (body-attached end 22) attached to the body 12 of the connection component.

Figure 3:
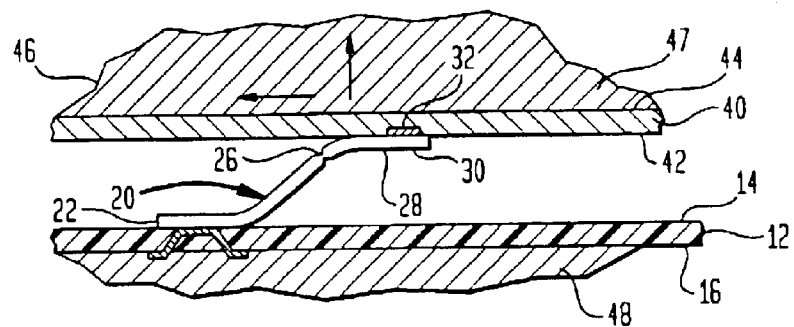
FIG. 3 is diagrammatic sectional view depicting the element of FIG. 1 in conjunction with a further element during a later stage of the process.

In the next stage of the process, the temporary support 40 and the connection component body 12 are moved vertically away from one another through a predetermined displacement and are also moved horizontally relative to one another so that the first end 30 of each lead moves horizontally toward the second end 22 of the lead. For example, as shown in FIG. 3, the temporary support 40 may be engaged with an upper platen 46, whereas the connection component, body 12, may be engaged with a lower platen 48. Such engagement may be maintained by applying a vacuum through each of the platens to hold the temporary structure and connection component body firmly in engagement with the platens as the platens move away from one another. The upper platen may be moved relative to the lower platen in the directions indicated by arrows V and H in FIG. 3. The relative movement of the lead ends bends the main portion 24 of each lead towards a vertically extensive disposition. As seen in FIG. 3, the lead tends to bend at the frangible portion or weak spot 26 to a greater degree than in other portions. Because the stub end 28 is short and hence stiffer than the lead main portion 24, the frangible section 26 of each lead remains close to the bottom surface 42 of the temporary support.

Figure 4:
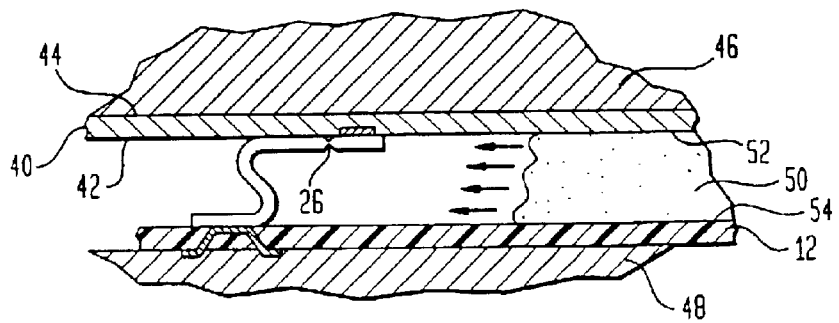
FIG. 4 is a view similar to FIG. 3 but depicting a later stage of the process.

Continued vertical movement and horizontal movement over the upper platen 46 and temporary support 40 relative to the lower platen 48 and connection component body 12 tends to bend the lead and ultimately to buckle the lead to a generally S-shaped configuration shown in idealized form in FIG. 4.

During or after movement of the temporary support 40 away from the connection component body 12, a flowable material such as a liquid composition 50 capable of curing to form a compliant dielectric material such as a gel or an elastomer is injected between the connection component body and temporary support. For example, the curable liquid may be a silicone or epoxy composition of the types disclosed in the aforementioned patents and patent applications. If the flowable composition is injected during the movement step, the pressure of the flowable composition may help to force the temporary support away from the body 12 and may also serve to maintain the temporary support 40 and body 12 in engagement with the platens. The flowable material is then cured to form a compliant dielectric layer having first surface 52 formed in contact with the temporary support and second surface 54 formed in contact with the connection component body 12. If the curing step requires appreciable time, the curing step may be conducted in a separate fixture after removing the parts from between the platens.

After curing, the temporary support 40 is pulled upward, away from the connection component of body 12 and cured layer 50. This breaks the frangible sections 26 of the leads, leaving each lead with a broken tip 56 at or adjacent the first surface 52 of the cured layer. Desirably, the broken tips are pulled upwardly as the temporary support is pulled upwardly, so that each broken tip projects slightly above the first surface 52 of the cured layer. The leads will break reliably at their frangible sections because the frangible sections are the weakest points in the leads and, moreover, because the frangible sections have been deformed to a greater degree than the other sections of the leads during the movement and bending process. Desirably, the degree of strain applied to the material in the frangible sections during the lead movement and bending process is above the fatigue limit of the material but below the breaking strain of the material. Stated another way, the leads are selectively weakened in the frangible sections by local flexure during the movement process.

The horizontal positions of the broken tips 56 are set by the original dimensions of the lead and by the well-controlled movement of the temporary support relative to body 12 prior to breakage. Thus, each broken tip lies in a known, predictable horizontal position relative to the associated terminal structure 18.

Figure 5:
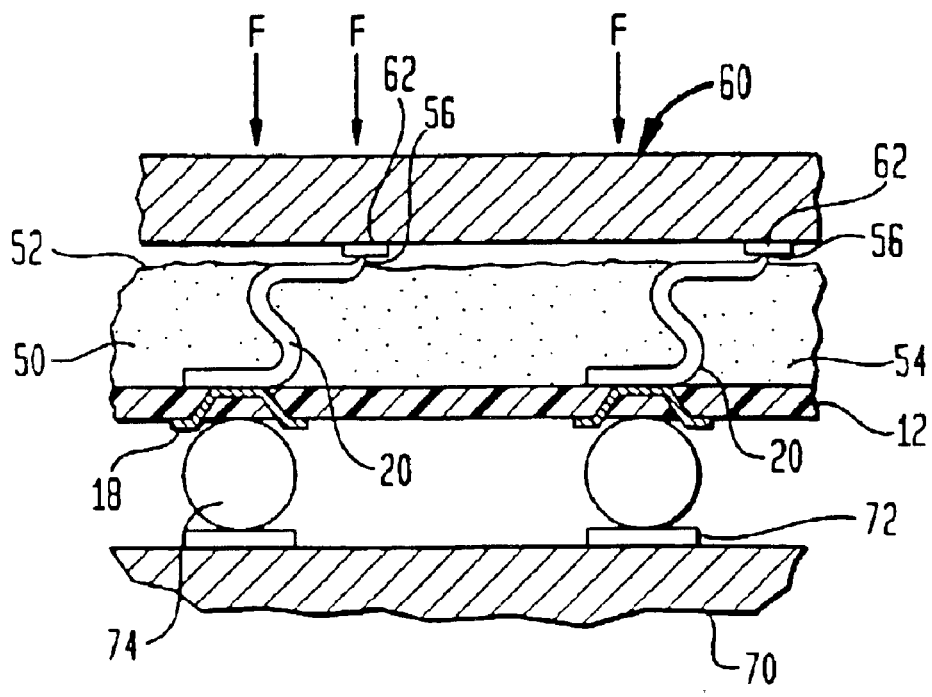
FIG. 5 is a view similar to FIG. 4 but depicting the elements shown in FIGS. 1–5 at a still later stage of the process.

The resulting connection component can be interposed between any two microelectronic elements to provide a reliable connection therebetween. For example, as seen in FIG. 5, the connection component is interposed between a semiconductor chip 60 having contacts 62 on a front surface and a circuit board 70. The terminal structures 18 are solder bonded to contact pads 72 on a circuit board. The front or contact-bearing surface of the chip confronts the first surface 52 of cured dielectric layer 50, and contact 62 are engaged with the broken tips 56 of leads 20. A force is applied to the rear surface of the chip by a spring (not shown) to maintain such engagement. The broken tips of the leads provide a microscopic roughness or asperities, which tend to dig into the surfaces of the contacts and to promote reliable electrical contact despite contaminants on the contacts. If desired, the tips can be further treated to provide additional roughness or asperities. A hard metal such as rhodium or osmium may be provide at the broken ends as, for example, by plating such metal at the frangible sections when the leads are formed. The hard metal may help to provide a brittle portion at the frangible section. The finished connection component thus has broken lead ends 56 at first surface 52 of the dielectric layer and has the terminal structures 18 on body 12 overlying the second surface 54 over the cured dielectric layer. The resulting structure provides a compliant interconnection between the circuit board 70 and chip 60. Thus, movement of contact 72 relative to the contact 56 of the chip will be accommodated by deformation of leads 20 and compliant layer 50, so that little or no stress will be applied to solder 74.

Figure 6:
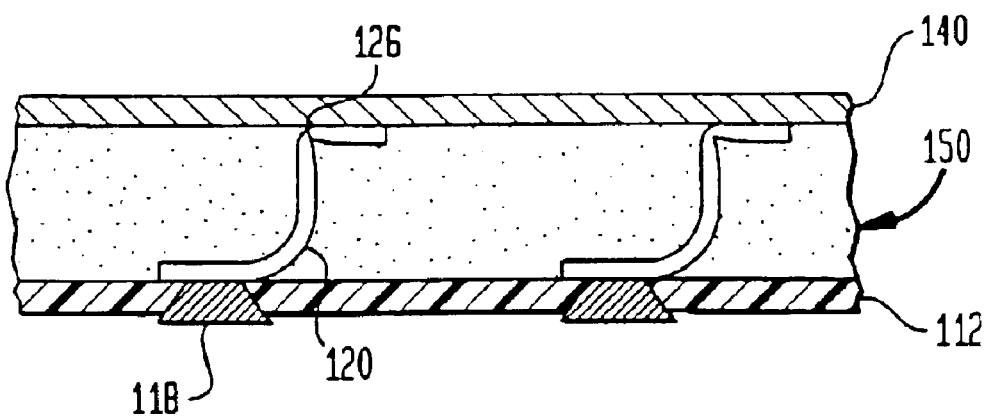
FIG. 6 is a view similar to FIG. 3 but depicting elements during a further process according to the invention.
Figure 7:
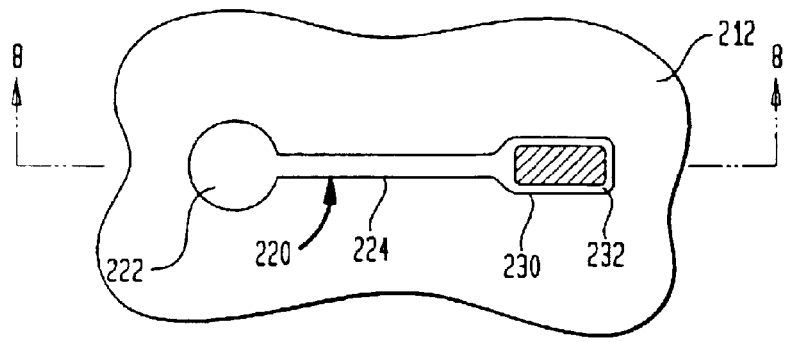
FIG. 7 is a diagrammatic, fragmentary view depicting portions of an element used in a further process according to the invention.
Figure 8:
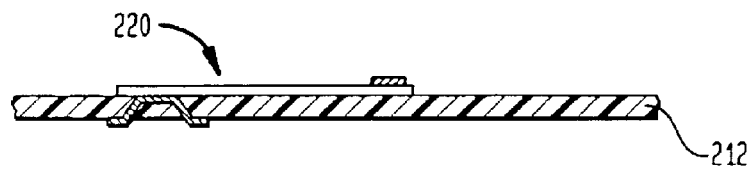
FIG. 8 is a diagrammatic, sectional view taken along the line 8—8 in FIG. 7.

As shown in FIG. 6, the pattern of platen movement, and hence the pattern of movement of the temporary support 140 relative to the dielectric connection component body 112 may be varied so as to bend the leads into a simply-curved shape rather than the s-shape discussed above with reference to FIGS. 1–5. Such a simply-curved shape may be produced, for example, by limiting the horizontal component of motion of the temporary structure relative to the dielectric body.

The connection component, process and connector illustrated in FIGS. 7–11 are similar to the corresponding connection component, process and connector discussed above with reference to FIGS. 1–5. However, the leads 220 of the component in FIGS. 7–11 do not have frangible sections, but instead have continuous main sections 224 extending between their body-attached ends 222 and their free ends 230, Further, the bonding material 232 and the surface properties of the bottom surface 242 on the temporary support 240 (FIGS. 9-10) are selected so that bonding material 230 forms a releasable bond with the bottom surface 242. As used in this disclosure, the term "releasable bond" means a bond, which can be broken or degraded reliably without destroying the bonded parts. The particular bonding material in FIGS. 7–11 is a peelable adhesive.

Figure 9:
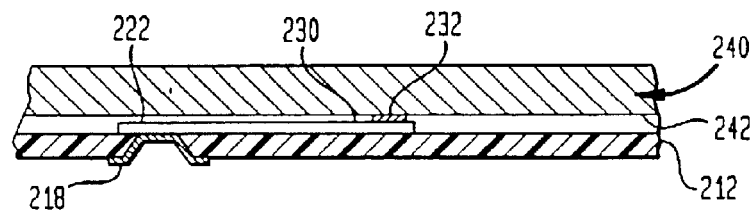
FIG. 9 is a diagrammatic, sectional view similar to FIG. 8 but depicting the elements of FIGS. 7–8 in conjunction with further elements during a later stage of a process.
Figure 10:
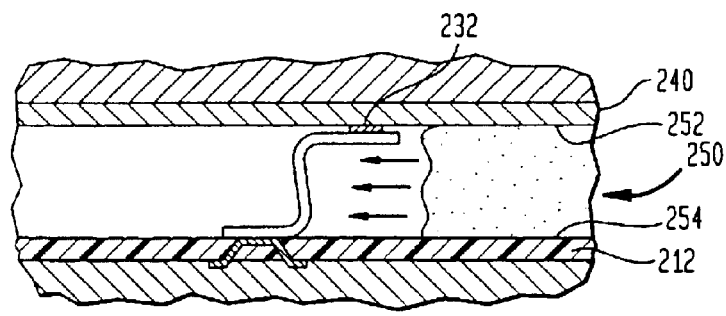
FIG. 10 is a view similar to FIG. 9 but depicting the elements of FIGS. 7–9 during a still later stage of the process.
Figure 11:
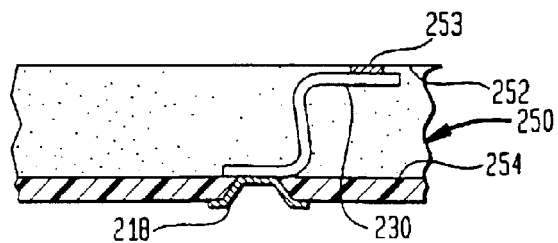
FIG. 11 is a view similar to FIG. 10 but depicting the elements at a still later stage of the process.

In the process, the support 240 is forced downwardly against the leads and connection component body 12 so as to engage the adhesive 232 on the free ends of the leads with the bottom surface 242 of the support (FIG. 9). Here again, at this stage of the process, each lead has a first end 230 attached to the temporary support and a second end 222 attached to connection component body 212 by a terminal structure 218. The temporary support and connection component body is moved vertically and horizontally relative to one another in the manner discussed above so as to bend each of the leads to a generally vertical configuration. Here again, a flowable material 250 is introduced between the support and connection component body and cured to form a compliant layer having a first surface 252 in contact with the bottom surface of the temporary support 240 and having a second surface 254 at the connection component body. After curing, the temporary support 240 is peeled away from the first surface 252 of the cured dielectric layer, taking the adhesive 232 with it. The support structure and the adhesive protect the free ends of the leads from the flowable material 250 during injection and curing of the flowable material, so that at least some portion of each free end will be bare when the adhesive is removed. Desirably, the temporary support is selected so that the adhesive 232 on the lead ends forms a stronger bond with the temporary support than with the lead ends, thus assuring that the adhesive will be fully removed when the temporary support is removed. Alternatively or additionally, the first surface 252 may be washed with a solvent effective to remove any residue of adhesive 232.

The resulting connector (FIG. 11) has the first end or free end 230 of each lead exposed at the first surface 252 of the cured dielectric layer and has terminal structures 218 overlying the second surface 254 of the cured dielectric layer. The free ends 230 may be recessed slightly relative to the first surface 252, depending upon the thickness of adhesive 232. However, the free ends will be accessible at the first surface through apertures 253 in the first surface. A connector in accordance with this embodiment of the invention also can be engaged between a pair of microelectronic elements such as a chip and a circuit board, a pair of circuit boards or the like. If desired, the connector can be bonded in place, as by using solder balls or other electrically conductive materials at the free ends as well as at the terminal structure 218.

Other releasable bonding materials may be used in place of the adhesive 232. For example, adhesives which are degradable by application of heat may be employed, and the adhesive bonds may be released after formation of the cured dielectric layer by application of heat. Alternatively, if the temporary support 240 is transparent to radiation, the adhesive may be degraded by such radiation. In yet another variant, the releasable bonding material may be a solder or other metallic bonding material is adapted to liquefy upon application of heat. In this case, the bonding material is liquefied once when the temporary support structure is applied to the lead ends and then liquefied again during removal of the temporary support structure. Some portions of the solder may remain adherent to the free ends 232 of the leads. However, this does not pose a particular problem provided that the composition of the solder is compatible with the other metals used in the system.

Figure 12:
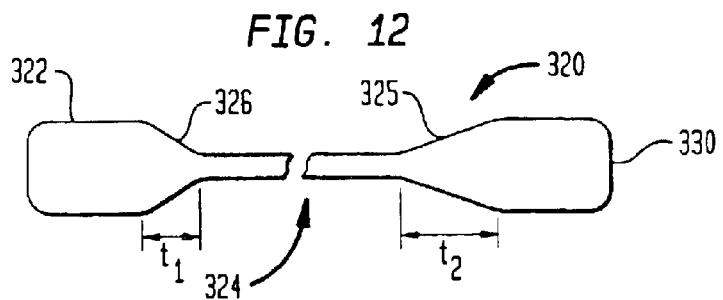
FIG. 12 is a diagrammatic, plan view of a lead used in a component according to yet a further embodiment of the invention.
Figure 13:
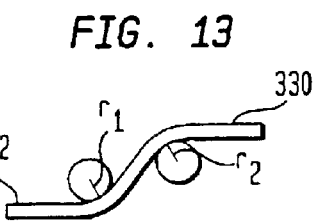
FIG. 13 is a diagrammatic, elevational view depicting the lead at a later stage in its processing.

The lead 320 depicted in FIG. 12 has a shape arranged to promote bending into a smooth, S-shaped curve. Thus, the lead has a first end 330 and a second end 322, which can be fastened to opposing elements and moved vertically with respect to one another as discussed above. Between these ends, the lead has a midsection 324, which is relatively narrow. The lead also has transition sections 325 and 326 joining the midsection with the ends. The lead is of uniform thickness. The lead has a minimum width in a main section 324. The width of the lead increases progressively in the direction toward the ends of the leads, away from the mid-section in transition sections 325 and 326. Because the width increases progressively, the moment of inertia of the lead in vertical bending (i.e., in bending perpendicular to the plane of the drawing in FIG. 12) also increases progressively in the direction towards the ends of the lead. This lead configuration promotes bending of the lead into a smooth s-shaped curve as illustrated in FIG. 13 with gradually-varying radii of curvature $R_1$ and $R_2$ adjacent the ends of the lead. A similar effect can be achieved by progressively varying the thickness of the lead so that the thickness increases gradually in the direction towards the ends of the lead. However, this is more difficult to achieve with common lead-fabrication processes. Also, different lead shapes may be used as disclosed in copending, commonly assigned U.S. patent applicaton Ser. Nos. 08/927,601 and 09/712,855 the disclosures of which are incorporated by reference herein.

In the embodiment of FIGS. 14–15, the temporary support 440 is a polymeric sheet such as a styrene polymer or other readily soluble polymer. Temporary support 440 has terminal structures 419 similar to the terminal structures 418 provided on the dielectric connection component body 412. Thus, the leads 420 are connected between the temporary support or first-element terminal structures 419 and the connection component or second-element terminal structures 418. In the condition illustrated in FIG. 14, the temporary support 440 has been moved with respect to the connection component body, and the leads have been bent towards vertically extensive configurations. The cured dielectric compliant layer 450 has been formed by injecting the flowable material into the space between temporary support 440 and body 412 in the same manner as discussed above. After curing the compliant layer, temporary support 440 is removed by dissolving it, as by exposing the component to a solvent which dissolves the material as temporary support 440 but which does not substantially attack the material of compliant layer 450 or the material of the dielectric support 412. This leaves terminal structures 419 projecting from the first surface 454 of compliant layer 450. In variants of the process, the temporary support is aluminum or other metal which is etchable by an etchant which does not substantially attack the leads and terminal structures.

In the embodiment of FIG. 16, each of leads 520 has a releasable bonding material 532 at both ends. The leads are engaged between a pair of temporary support structures 540 and 541. Thus, each lead has a first end 530 connected to a first temporary support structure and a second end 522 connected to the opposite temporary support structure. The temporary support structures are moved relative to one another in the same manner as the support structure and connection component bodies discussed, so as to bend the leads towards a generally vertical configuration. Here again, a flowable material such as a liquid composition is injected around the leads to form a dielectric layer 550. After formation of the dielectric layer, the bonds formed by the bonding material 532 are released. For example, where the releasable bonding material is a peelable adhesive, the support structures 540 and 541 may be peeled away from the cured dielectric layer. Where the releasable bonding material is a solder, the assembly may be heated so as to liquefy the solder and allow removal of the support structures 540 and 541. This results in a connection component having leads with first ends 530 exposed at the first surface 552 of the cured dielectric layer and having second ends 522 exposed at the second surface 554 of the cured layer. Thus, both ends of the leads have the same configuration as discussed above with reference to the first ends 230 of the leads depicted in FIG. 11.

A process according to a further embodiment of the invention uses a temporary support 640 (FIG. 17) incorporating a main structural layer 639 and an electrically conductive sacrificial layer 641 releasably held in place on the bottom surface of main layer 639 by a adhesive 633. Structural layer 639 has a predictable, isotropic coefficient of thermal expansion. Desirably, where the support is to be used in conjunction with a silicon-based element as discussed below and where features formed on the support are to be engaged with such a silicon-based element, the coefficient of thermal expansion of structural layer 639 is close to that of silicon, i.e., below about $6.0\times10^{-6}/°$ C. and more preferably between about $1.5\times10^{-6}/°$ C. and $6\times10^{-6}/°$ C. Preferred materials for the structural layer includes silicon, quartz, glasses and metals having coefficients of thermal expansion within the preferred ranges as, for example, molybdenum invar and alloys thereof.

Adhesive 637 desirably is a degradable adhesive, which can be released by application of heat or radiation. Where the adhesive is arranged to degrade in response to applied radiation, structural layer 640 desirably is transparent to such radiation. Silicon, quartz and glasses are particularly preferred for use with radiation-releasable adhesives. Sacrificial layer 641 most preferably is substantially thinner than the structural layer, so that expansion and contraction of the support structure as a whole is controlled by the structural layer. The sacrificial layer is formed from an electrically conductive material different from the materials to be used in the leads formed on the sacrificial layer as further discussed below. For example, where the leads have exposed copper surfaces, the sacrificial layer desirably is formed from aluminum or an aluminum-based alloy. Where the leads are formed principally from gold or gold alloys, sacrificial layer 641 may be formed from aluminum or aluminum based alloys or, more preferably, from cooper or copper based alloys.

In a process according to one embodiment of the invention, leads 620 are formed on the bottom surface 642 of the sacrificial layer by electroplating, using the electrical conductivity of the sacrificial layer. Preferably, a photoresist 643 is coated onto the bottom surface 642 and photographically patterned to provide apertures in areas where the leads are to be formed. The metal used to form the leads is then deposited into the apertures by electroplating. Assuming that layer 641 is formed from aluminum, and a copper-based lead is to be formed, the copper may be deposited directly onto the aluminum. Alternatively, a thin layer of gold or other non-reactive metal may be deposited into the openings in the resist prior to forming the leads and a further layer of gold may be applied onto the surfaces 621 of the leads facing away from the sacrificial layer so as to form a jacket of gold 623 surrounding the copper core 625 of the lead. As best seen in FIG. 17, each lead is formed with a relatively large first end 622, a somewhat smaller second end 630 and a main region 624 extending between the ends. The main region is curved in horizontal directions and is narrower than the end regions. Using a separate resist, a bonding material 632 is applied on the second ends 630 of the leads. This second resist is then removed.

After removing the second resist, the bottom surface of the sacrificial layer with the leads thereon is exposed to an etchant which attacks the sacrificial layer but which does not substantially attack the material of the leads or the bonding material. Where the sacrificial layer is aluminum and the leads are copper, the etchant may be an alkaline solution. The etching process attacks the sacrificial layer in regions which are not covered by the leads and also begins to remove sacrificial layer material in regions covered by the leads. Such removal proceeds from the outer edges of the leads and progresses inwardly. The process is stopped at the stage illustrated in FIGS. 19 and 20, where a relatively large anchor 635 made of sacrificial layer material connects the first end 622 of each lead to the newly etched bottom surface 642' of the sacrificial layer. Also, a smaller connecting element 637 of sacrificial layer material remains between the second end 630 of each lead and the newly formed bottom surface 642' of the sacrificial layer. In this condition, the first ends 622 of the leads are firmly attached to the sacrificial layer, whereas the second end 630 are releasably attached to the sacrificial layer and hence to the support structure 640 as a whole.

The support structure and leads are then juxtaposed with a second element 612 such as a semiconductor wafer having contacts 613 thereon. The dimensional stability imparted by the support structure, and particularly by structural layer 639 provides significant benefits in achieving precise alignment between the tips or second ends 630 of the leads and the contacts 613 on the second element. Because the coefficient of thermal expansion of the support structure as a whole is very close to that of wafer 612, temperature changes during the process, as, for example, when the parts are heated in the bonding step, will introduce only minimal changes in the alignment between the lead second ends and the contacts 613 on the wafer. The bonding material 632 on the lead second ends is activated, as by heating the assembly.

After bonding, the support structure 640 is moved upwardly relative to the second element or wafer 612, to the position illustrated in FIG. 21. During movement, the small connectors 637 break away from the sacrificial layer 641 or from the second ends 630 of the leads. Because leads 620 are initially curved in the horizontal direction, no relative horizontal movement of support structure 640 and the second element 612 is required. However, such relative horizontal movement may be used, if desired, to impart additional curvature to the bent leads. Once again, a flowable material is injected between the support structure and the second element and cured to form a cured dielectric layer 650 having a first surface 652 in contact with the support structure and a second surface 654 in contact with the second element 612. After curing the dielectric layer, adhesive 633 is degraded so as to release the structural layer 639 from sacrificial layer 641. After removing the structural layer, sacrificial layer 641 is removed by etching using an etchant which does not appreciably attack the leads and other elements of the structure. Here again, an alkaline etching solution may be employed where the sacrificial layer is formed from aluminum. At the same time as the sacrificial layer is removed, the sacrificial layer material forming anchors 635 is also removed, leaving the first ends 622 of the leads exposed at the first surface 652 of layer 650 through apertures 655. The first ends can be provided with solder bumps, terminal structures or other additional structures to facilitate connections with circuit boards or other microelectronic elements. After processing, the entire assembly, including the wafer 612 and cured dielectric layer 650 can be subdivided to form individual units, each including one or more chips present in wafer 612, as by severing the assembly along planes 657.

The process of FIGS. 17–22 yields packaged microelectronic devices such as packaged semiconductor chips. A connector, rather than a packaged device can be made by essentially the same process. Thus, as seen in FIG. 23, connection component having a dielectric body 712 and having terminal structures 718 may be used in place of the wafer so as to form the connector of FIG. 23. In other respects, the process is essentially the same. The connector of FIG. 23 can be employed in generally the same way as the connectors discussed above with reference to FIGS. 1–16. Conversely, the processes discussed above with reference to FIGS. 1–16 for use in forming connectors can be modified to yield packaged semiconductor devices such as packaged chip or wafers, by substituting a chip, wafer or an assemblage of plural discrete chips for the connection component used in said processes.

In a further variant of the process illustrated in FIGS. 17–22, the tips or second ends 630 of the leads are bonded to a further temporary support including a sacrificial layer such as an aluminum sheet. The two temporary supports are moved away from one another so as to bend the leads, and the curable material is injected and cured. Both temporary supports are then removed by etching, leaving the ends of the leads exposed at both surfaces of the cured compliant layer so as to form a connector. The etching process may remove both of the temporary supports in a single step.

In an further variant of the process shown in FIGS. 17–22, a subtractive lead-forming process is used instead of the additive process. Thus, a sheet of a lead-forming metal such as copper may be laminated onto the bottom surface 642 of the sacrificial layer and covered by a photoresist in the areas where the leads are to be formed. The sheet is then etched, as by exposure to an HCL/CuCl. solution which attacks the material of the lead-forming sheet but which does not appreciably attack sacrificial layer 641, whereupon the resist used in the lead-forming process is removed.

The process depicted in FIGS. 24–26 is generally similar to the processes of FIGS. 17–23. However, in the process of FIGS. 24–26, the support structure 839 includes only a single, relatively thick layer formed from a sacrificial material such as aluminum. Also, leads 820 have terminal structures 818 extending into sacrificial layer 840 from the bottom surface 842 thereof. Here again, the sacrificial layer is etched on its bottom surface so as to remove portions of the sacrificial layer, leaving small portions or connectors 837 releasably securing the second ends 830 of the leads. The first ends 822 remain secured to the sacrificial layer by terminal structures 818. The terminal structures may be formed simultaneously with the leads, by plating the metal constituting the leads onto the bottom surface of the sacrificial layer in a manner similar to that discussed above. Alternatively or additionally, terminal structures 818 may include additional metallic elements formed in or inserted into depressions in the bottom surface of the sacrificial layer. After attachment to the opposite element, such as a connection component 812 (FIG. 26) or a wafer, the sacrificial layer or support structure 840 is moved away from the opposite element in the manner described above. Once again, a curable liquid material is introduced to form a dielectric layer 650 having a first surface 652 in contact with the bottom surface 842 of the sacrificial layer. Upon removal of the sacrificial layer, terminal structures 818 project upwardly, beyond the first surface 652 of the sacrificial layer.

The process partially illustrated in FIGS. 27 and 28 is also similar to the processes of FIGS. 17–23. Each lead 920 is formed with a main layer 921 and a sacrificial layer 923 disposed between the main layer of the lead and the support structure 939. Sacrificial layer 923 has a different composition than the main layer 921. For example, the sacrificial layer 923 may be formed from copper whereas the main layer 921 may be formed from gold. Support structure 939 may be electrically conductive or non-conductive. However, a conductive support structure such as an aluminum layer facilitates deposition of the leads on the support structure. After formation of the dual layer leads, the leads are subjected to etching using an etchant which does not substantially attack the main layer 921 and which may or may not attack the support structure 939. Once again, the etching process is controlled so as to leave a large anchor 935 formed from the sacrificial layer 923 adjacent a first end 922 of each lead and to leave a small, breakable attachment 937 adjacent the second or free end 930 of the lead. A bonding material 932 may be applied on the second or free end of the lead. The remainder of the process may proceed in substantially the way as discussed above with reference to FIGS. 17–23.

The process of FIGS. 29–32 is generally similar to the process of FIGS. 17–23. Here again, support structure 1040 includes a structural layer 1039 having the desired coefficient of thermal expansion and a sacrificial layer 1041 at the bottom surface of the support. The sacrificial layer again is bonded to the structural layer 1039 by a degradable adhesive 1033. A more complex structure including a top dielectric layer 1011, a middle dielectric layer 1013 and a bottom dielectric layer 1015 is formed on the bottom surface of the sacrificial layer 1041. This structure also includes conductive elements such as through vias 1003, traces 1005 and more complex conductor structures such as conjoined traces 1007 and vias 1009. The dielectric layers can be formed by processes such as electrophoretic deposition or spin-coating on the surface of the support structure. Vias may be formed in these layers by conventional processes such as laser ablation or etching. Metallic conductive structures can be provided using additive processes such as plating and subtractive such as etching employing the conductive sacrificial layer 1041 to convey plating or etching currents. Other conductive structures such as electrically conductive ground and power planes may be provided. Temporary connections between the sacrificial layer and the structures being formed may be provided by forming temporary conductive features (not shown) in areas of the dielectric layers which will later be removed from the finished product. The conductive features formed on the dielectric layers include leads 1020 formed on a bottom surface 1017 of bottom dielectric layer 1015. Bonding material 1032 is applied at the tip ends of the leads.

Figure 30:
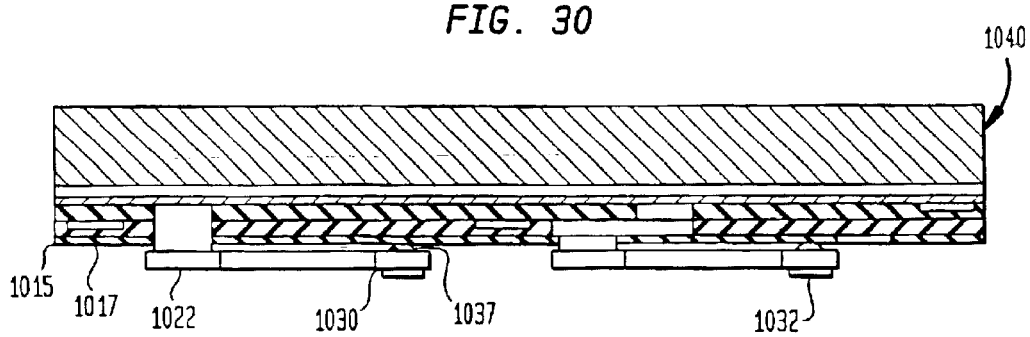
Figure 31:
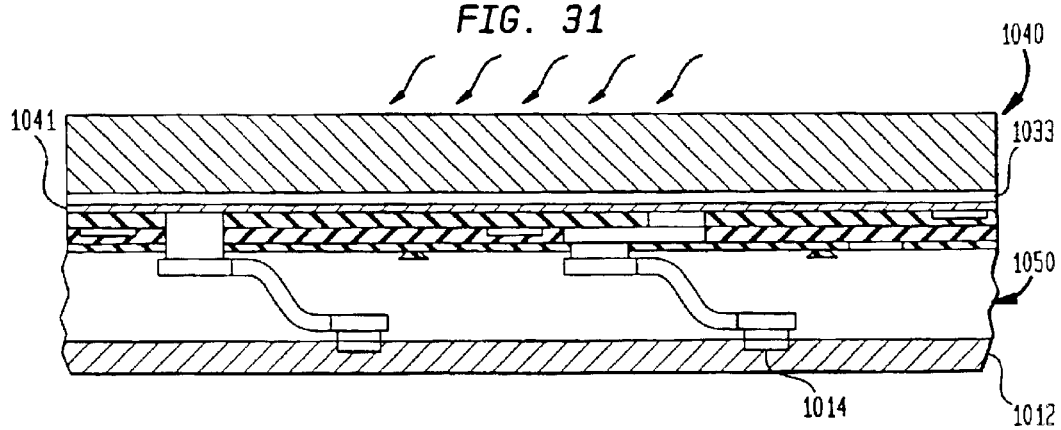
Figure 32:
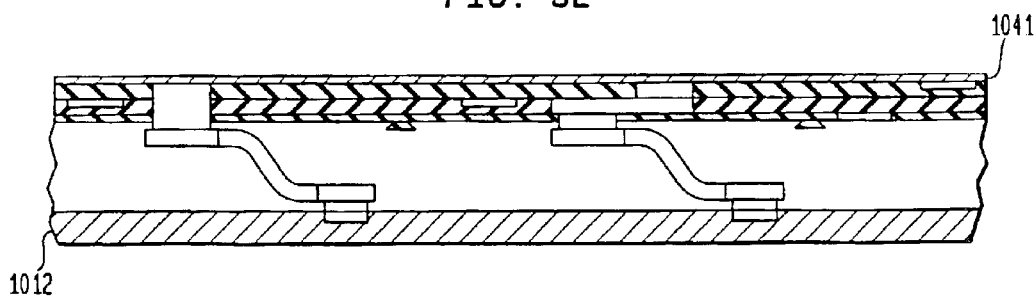

In the next stage of the process, the dielectric structure is subjected to etching such as plasma etching using an oxidizing plasma so as to remove materials from the bottom surface of the bottom dielectric layer 1015, thereby forming a new bottom surface 1017 (FIG. 30). In a manner similar to that discussed above with reference to FIGS. 19 and 20, etching removes material from those areas of the surface which are not covered by the leads and also starts to remove material covered by the leads, commencing at the outer edges of the leads and working inwardly from the edges of each lead. The etching process is stopped when a small connector 1037 remains at the tip or second end 1030 of each lead. Processes for plasma etching to form releasable attachments between leads and polymeric structures are discussed in greater detail in the aforementioned copending, commonly assigned U.S. patent application Ser. Nos. 09/020,750 and 09/195,371 the disclosure of which is incorporated by reference herein. The first ends 1022 of the leads desirably are fixed to the polymeric structure by further conductive structures extending into the polymeric structure.

Figure 33:
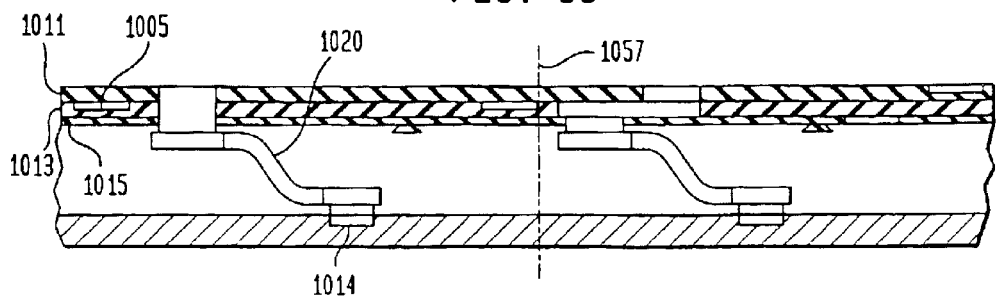

In a manner similar to the processes discussed above, the support structure 1040, with the polymeric structure, conductive features and leads thereon is juxtaposed with mating elements such as wafer 1012. The tip ends of the leads are bonded to contacts 1014 on the wafer and the two elements—the support structure and the wafer—are moved apart from one another. Here again, the flowable material is introduced and cured to form a dielectric layer 1050. Once again, the adhesive 1033 between the structural layer and the sacrificial layer 1041 is degraded, as by applying radiation through the structural layer leaving the assembly in the condition illustrated in FIG. 32. The sacrificial layer 1041 is then etched so to expose the top most polymeric layer 1011 (FIG. 33). The assembly may then be severed, as by cutting along severance lines 1057 so as to form individual units. The diverse conductive structures carried on dielectric layers 1011, 1013 and 1015 provide interconnections in and to the packaged unit. Vias 1003 and 1009 provide terminals exposed at the top surface of the top dielectric layer. Some of the traces 1005 may interconnect various leads 1020 and thus interconnect contacts 1014 of the chip with other conductive structures. As described in greater detail in copending, commonly assigned in International Patent Publication WO 98/44564, the disclosure of which is hereby incorporated by reference herein, the interconnections within the chip package may serve as a signal conductors so as to connect various elements of the chip with one another. As also described in the '564 publication, and as described in further detail in commonly assigned International Patent Publication WO 97/11588 and in commonly assigned, copending U.S. patent application Ser. No. 09/140,589 filed Aug. 26, 1998; 09/020,754, filed Feb. 9, 1998, the disclosures of which are also incorporated by reference herein, the lines connecting high speed circuits within a chip may be formed as striplines or multiconductor signal lines so as to provide connections with controlled, predictable impedance. As further described in the these publications and applications, the leads may be formed as multiconductor structures. Thus, the leads used in the above-described embodiment may themselves include a dielectric layer such as a polyimide layer disposed between a pair of conductive strips. As discussed in the Ser. Nos. 09/020,750 and 09/195, 371, the leads may be formed as coaxial structures with a contact connector and an outer conductive jacket separated by a dielectric layer.

Numerous variations and combinations of the features discussed above may be utilized without departing from the invention as defined by the claims. For example, the processes discussed above may be modified by substituting a mechanical separation process for the etching steps discussed above. For example, in the process of FIGS. 29–33, the dielectric layers formed on the temporary support may be simply peeled away from the support, without etching a sacrificial layer. In this case, the sacrificial layer may be omitted. In a further variant, individual chips may be connected to the leads carried on a single support structure and all of these chips may be moved away from the support structure in a single operation in the manner described in U.S. Pat. No. 5,798,286. In another variant, more fully discussed in the aforementioned U.S. patent application Ser. No. 08/989,312, the sacrificial layer of the support structure is only partially removed, leaving portions of the sacrificial layer as terminals connected to the leads. Also, sacrificial layers other than the aluminum and polymeric sacrificial layers discussed above may be employed. As these and other variations and combinations may be employed, the foregoing description of the preferred embodiments should be taken by way of illustration rather than by way of limitation of the invention as defined by the claims.

What is claimed is:

1. An interconnect component comprising a compliant layer and a plurality of electrically conductive leads having first ends and extending through said compliant layer, said electrically conductive leads being flexible and adapted to deform in conjunction with deformation of the compliant layer, said first ends comprising elongated portions of said leads exposed at a first surface of said compliant layer and being located at or near said first surface.

2. The component of claim 1 wherein said compliant layer has a second surface opposite said first surface.

3. The component of claim 2 wherein said leads have second ends opposite said first ends, said second ends being located at or near the second surface of the compliant layer.

4. The component of claim 1 wherein said leads have midsections with a width less than the width of said first ends.

5. The component of claim 3 wherein said leads have midsections with a width less than the width of said first ends.

6. The component of claim 4 wherein said leads have second ends opposite said first ends and wherein said midsections of said leads have a width less than the width of said second ends.

7. The component of claim 3 wherein said first ends of said leads are located at upper sides of said leads and said second ends are located at lower sides of said leads so that the upper sides are exposed at the first surface of the compliant layer and the lower sides are exposed at the second surface of the compliant layer.

8. The component of claim 5 wherein said first ends of said leads are located at upper sides of said leads and said second ends are located at lower sides of the leads.

9. The component of claim 1 further comprising releasable bonding material on said first ends.

10. The component of claim 9 wherein said releasable bonding material comprises an adhesive.

11. The component of claim 9 wherein said releasable bonding material comprises a solder.

12. The component of claim 3 further comprising releasable bonding material on said first ends.

13. The component of claim 12, further comprising releasable bonding material on said second ends.

14. The component of claim 12 wherein said releasable bonding material comprises an adhesive.

15. The component of claim 12, wherein said releasable bonding material comprises a solder.

16. The component of claim 1 further comprising a temporary support structure, said first ends being connected to said temporary support structure.

17. The component of claim 3 further comprising a first temporary support structure and a second temporary support structure.

18. The component of claim 17 wherein said first ends are connected to said first temporary support structure and said second ends are connected to said second temporary support structure.

19. The component of claim 18, wherein said leads extend between said first temporary support structure and said second temporary support structure in a generally vertical configuration.

20. An interconnect component comprising a compliant layer having a first surface and a plurality of electrically conductive leads having first ends and extending through said compliant layer, said electrically conductive leads being flexible and adapted to deform in conjunction with deformation of the compliant layer, said first ends extending generally parallel to said first surface.

21. The component of claim 20 wherein said compliant layer has a second surface opposite said first surface.

22. The component of claim 21 wherein said leads have second ends opposite said first ends, said first ends being located at or near the first surface and said second ends being located at or near the second surface of the compliant layer.

23. The component of claim 20 wherein said leads have midsections with a width less than the width of said first ends.

24. The component of claim 22 wherein said leads have midsections with a width less than the width of said first ends.

25. The component of claim 23 wherein said leads have second ends opposite said first ends and wherein said midsections of said leads have a width less than the width of said second ends.

26. The component of claim 22 wherein said first ends of said leads are located at upper sides of said leads and said second ends are located at lower sides of said leads.

27. The component of claim 24 wherein said first ends of said leads are located at upper sides of said leads and said second ends are located at lower sides of the leads.

28. The component of claim 20 further comprising releasable bonding material on said first ends.

29. The component of claim 28 wherein said releasable bonding material comprises an adhesive.

30. The component of claim 28 wherein said releasable bonding material comprises a solder.

31. The component of claim 22 further comprising releasable bonding material on said first ends.

32. The component of claim 31, further comprising releasable bonding material on said second ends.

33. The component of claim 31 wherein said releasable bonding material comprises an adhesive.

34. The component of claim 31 wherein said releasable bonding material comprises a solder.

35. The component of claim 20 further comprising a temporary support structure, said first ends being connected to said temporary support structure.

36. The component of claim 22 further comprising a first temporary support structure and a second temporary support structure.

37. The component of claim 36 wherein said first ends are connected to said first temporary support structure and said second ends are connected to said second temporary support structure.

38. The component of claim 37, wherein said leads extend between said first temporary support structure and said second temporary support structure in a generally vertical configuration.

39. An interconnect component comprising a compliant layer and a plurality of electrically conductive leads having first ends and extending through said compliant layer, said first ends comprising elongated portions of said leads exposed at a first surface of said compliant layer and being located at or near said first surface, wherein said leads have midsections with a width less than the width of said first ends.

40. The component of claim 39, wherein said compliant layer has a second surface opposite said first surface, wherein said leads have second ends opposite said first ends, said second ends being located at or near the second surface of the compliant layer.

41. The component of claim 39, wherein said leads have second ends opposite said first ends and wherein said midsections of said leads have a width less than the width of said second ends.

42. An interconnect component comprising a compliant layer and a plurality of electrically conductive leads having first ends and extending through said compliant layer, said first ends comprising elongated portions of said leads exposed at a first surface of said compliant layer and being located at or near said first surface, a releasable bonding material on said first ends.

43. The component of claim 42, wherein said releasable bonding material comprises an adhesive.

44. The component of claim 42 wherein said releasable bonding material comprises a solder.

45. The component of claim 42, wherein said compliant layer has a second surface opposite said first surface, wherein said leads have second ends opposite said first ends, said second ends being located at or near the second surface of the compliant layer.

46. The component of claim 45, further comprising releasable bonding material on said second ends.

47. The component of claim 45, wherein said releasable bonding material comprises an adhesive.

48. The component of claim 42, wherein said releasable bonding material comprises a solder.

49. An interconnect component comprising a compliant layer and a plurality of electrically conductive leads having first ends and extending through said compliant layer, said first ends comprising elongated portions of said leads exposed at a first surface of said compliant layer and being located at or near said first surface, a temporary support structure, said first end being connected to said temporary support structure.

50. An interconnect component comprising a compliant layer and a plurality of electrically conductive leads having first ends and extending through said compliant layer, said first ends comprising elongated portions of said leads exposed at a first surface of said compliant layer and being located at or near said first surface, wherein said compliant layer has a second surface opposite said first surface, wherein said leads have second ends opposite said first ends, said second ends being located at or near the second surface of the compliant layer, a first temporary support structure and a second temporary support structure.

51. The component of claim 50, wherein said first ends are connected to said first temporary support structure and said second ends are connected to said second temporary support structure.

52. The component of claim 51, wherein said leads extend between said first temporary support structure and said second temporary support structure in a generally vertical configuration.

53. An interconnect component comprising a compliant layer having a first surface and a plurality of electrically conductive leads having first ends and extending through said compliant layer, said first ends extending generally parallel to said first surface, wherein said leads have midsections with a width less than the width of said first ends.

54. The component of claim 53, wherein said leads have second ends opposite said first ends and wherein said midsections of said leads have a width less than the width of said second ends.

55. An interconnect component comprising a compliant layer having a first surface and a plurality of electrically conductive leads having first ends and extending through said compliant layer, said first ends extending generally parallel to said first surface, wherein said compliant layer has a second surface opposite said first surface, wherein said leads have second ends opposite said first ends, said first ends being located at or near the first surface and said second ends being located at or near the second surface of the compliant layer, wherein said leads have midsections with a width less than the width of said first ends.

56. An interconnect component comprising a compliant layer having a first surface and a plurality of electrically conductive leads having first ends and extending through said compliant layer, said first ends extending generally parallel to said first surface, a temporary support structure, said first end being connected to said temporary support structure.

57. An interconnect component comprising a compliant layer having a first surface and a plurality of electrically conductive leads having first ends and extending through said compliant layer, said first ends extending generally parallel to said first surface, a releasable bonding material on said first ends.

58. The component of claim 57, wherein said releasable bonding material comprises an adhesive.

59. The component of claim 57, wherein said releasable bonding material comprises a solder.

60. An interconnect component comprising a compliant layer having a first surface and a plurality of electrically conductive leads having first ends and extending through said compliant layer, said first ends extending generally parallel to said first surface, wherein said compliant layer has a second surface opposite said first surface, wherein said leads have second ends opposite said first ends, said first ends being located at or near the first surface and said second ends being located at or near the second surface of the compliant layer, a releasable bonding material on said first ends.

61. The component of claim 60, further comprising releasable bonding material on said second ends.

62. The component of claim 60, wherein said releasable bonding material comprises an adhesive.

63. The component of claim 60, wherein said releasable bonding material comprises a solder.

64. An interconnect component comprising a compliant layer having a first surface and a plurality of electrically conductive leads having first ends and extending through said compliant layer, said first ends extending generally parallel to said first surface, wherein said compliant layer has a second surface opposite said first surface, wherein said leads have second ends opposite said first ends, said first ends being located at or near the first surface and said second ends being located at or near the second surface of the compliant layer, a first temporary support structure and a second temporary support structure.

65. The component of claim 64, wherein said first ends are connected to said first temporary support structure and said second ends are connected to said second temporary support structure.

66. The component of claim 65, wherein said leads extend between said first temporary support structure and said second temporary support structure in a generally vertical configuration.

* * * * *

UNITED STATES PATENT AND TRADEMARK OFFICE
CERTIFICATE OF CORRECTION

PATENT NO. : 6,828,668 B2 Page 1 of 1
DATED : December 7, 2004
INVENTOR(S) : John W. Smith and Belgacem Haba It is certified that error appears in the above-identified patent and that said Letters Patent is hereby corrected as shown below:

Column 1,
Lines 14, 22 and 30, "herein application" should read -- herein. Application --

Signed and Sealed this

Fifth Day of April, 2005

JON W. DUDAS
*Director of the United States Patent and Trademark Office*